United States Patent [19]

Eardley

[11] 4,423,338

[45] Dec. 27, 1983

[54] SINGLE SHOT MULTIVIBRATOR HAVING REDUCED RECOVERY TIME

[75] Inventor: David B. Eardley, Stanfordville, N.Y.

[73] Assignee: International Business Machines Corporation, Armonk, N.Y.

[21] Appl. No.: 353,455

[22] Filed: Mar. 1, 1982

[51] Int. Cl.³ .................. H03K 5/159; H03K 3/033
[52] U.S. Cl. .................................. 307/273; 307/602; 328/207
[58] Field of Search .................. 307/273, 602, 595; 328/207

[56] References Cited

U.S. PATENT DOCUMENTS

| | | | |
|---|---|---|---|
| 2,888,557 | 5/1959 | Schneider | 307/602 |
| 3,248,657 | 4/1966 | Turecki | 307/602 |
| 3,411,107 | 11/1968 | Rees | 331/111 |
| 3,601,636 | 8/1971 | Marsh, Jr. | |
| 3,768,026 | 10/1973 | Pezzutti | 328/207 |
| 3,786,357 | 1/1974 | Belle Isle | 307/602 |
| 3,792,362 | 2/1974 | Grant | 328/72 |
| 3,979,746 | 9/1976 | Jarrett | 307/273 |

OTHER PUBLICATIONS

Manual of Logic Circuits, p. 262, G. A. Maley, Prentice Hall 1970.
Electronic Design, vol. 14, Jul. 4, 1968, p. 102.

Primary Examiner—John S. Heyman
Attorney, Agent, or Firm—Robert J. Haase

[57] ABSTRACT

A single shot multivibrator comprising two inverting OR circuits connected in closed loop configuration by a cascaded series of delay elements some of which are partially bypassed at selected locations so as to reduce the recovery time of the multivibrator. The delay elements comprise one or more inverting OR circuits positioned at the selected locations with the remainder being simple inverting circuits. Although the output pulse width of the multivibrator is determined by the total delay of the cascaded units, the recovery time is made a fraction thereof, depending upon the number and the locations of the bypasses.

6 Claims, 5 Drawing Figures

SINGLE SHOT MULTIVIBRATOR HAVING REDUCED RECOVERY TIME

DESCRIPTION

BACKGROUND OF THE INVENTION

1. Field of the Invention

The present invention generally relates to closed loop single shot multivibrators and, more particularly, to those employing delay circuits connected between inverting logic circuits within the loop for controlling output pulse width.

2. Description of the Prior Art

Closed loop multivibrators are known in which a delay circuit, connected between two inverting OR circuits or between two NAND circuits within the loop, determines the output pulse width as well as the recovery time. An example of the former is given on page 262 of "Manual of Logic Circuits", G. A. Maley, Prentice Hall, 1970. The latter is shown in exemplary U.S. Pat. No. 3,601,636, issued to L. W. Marsh, Jr., on Aug. 24, 1971 and entitled Single-Shot Device.

For proper operation, the input pulse to the cited multivibrators must be inactive ("down" for the inverting OR case) for a length of time greater than the delay of the delay circuit and the input pulse width must be greater than the delay of the two inverting OR circuits or NAND circuits, as the case may be. If the input pulse cycle time is too short and does not meet the first of the two foregoing requirements, recovery of the multivibrator is incomplete with the consequence that the output pulse width becomes foreshortened and is less than the delay of the delay circuit.

It is desirable, for certain system applications, that the recovery time of the multivibrator be reduced below the delay of the delay network in such a way that corresponding reduction of the output pulse width is avoided.

SUMMARY OF THE INVENTION

Two logic circuits in closed loop single shot multivibrator configuration are connected together by a delay network comprising a number of cascaded inverting logic circuits of similar type wherein two or more of the cascaded circuits receive undelayed second inputs from the loop. The recovery time of the multivibrator is determined by the largest delay of the unbypassed inverting logic circuits in the delay network. The output pulse width is determined by the delay of the total number of inverting logic circuits in the delay network.

DESCRIPTION OF THE PREFERRED EMBODIMENT

Figure 1:
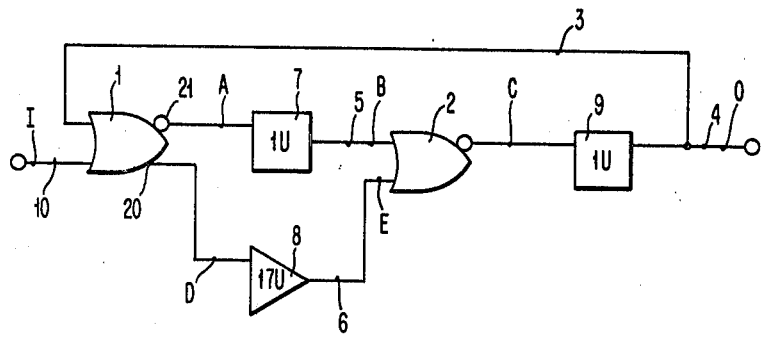
FIG. 1 is a schematic circuit of a typical prior art multivibrator.
Figure 2:
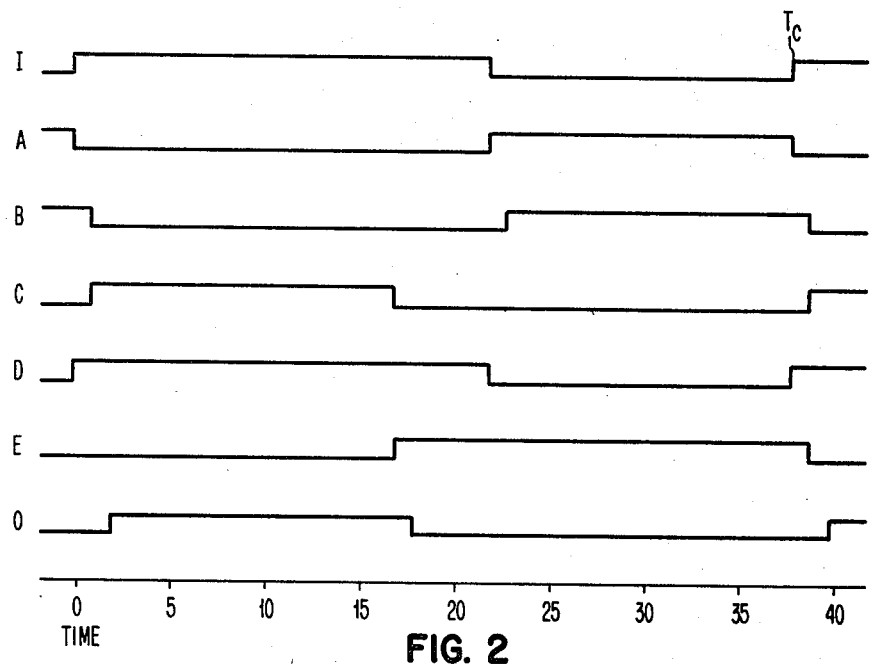
FIG. 2 is a series of idealized waveforms at various points within the circuit of FIG. 1.

The preferred embodiment can be better understood by first considering the prior art circuit operation represented by FIGS. 1 and 2. The single shot multivibrator of FIG. 1 comprises inverting OR circuits 1 and 2 which are arranged in a loop configuration by feedback line 3 extending between output 4 and one input to circuit 1. Inverting OR circuit 1 has an inverted output 21 and a non-inverted output 20. Output 20 is the logical OR of the inputs. Output 21 is the complement of output 20. Circuits 1 and 2 are connected together by paths 5 and 6. Path 5 ideally has zero delay while path 6 includes the delay element which determines the output pulse width and the recovery time of the multivibrator.

Circuits 1 and 2 also include inherent delay which is assumed to be one unit in the example of FIG. 1. The delay of the delay element is assumed to be 16 units. For the sake of illustration in making reference to the waveforms of FIG. 2, the 1 unit delay of circuit 1 has been transferred to the 1 unit delay 7 in path 5 and to the 17 unit delay 8 in path 6. Correspondingly, the 1 unit delay of circuit 2 has been transferred to the 1 unit delay 9. Thus, circuits 1 and 2, for the purpose of explanation of operation, will be considered to be ideal inverting OR logic switching circuits having no inherent delay.

The idealized waveforms of FIG. 2 assume that an input pulse I having a duration (or width) of 22 units is applied to input 10. The time between successive input pulses is 16 units for an overall repetition interval $T_c$ of 38 units. The other waveforms A, B, C, D, E and O of FIG. 2 have the polarities and durations indicated as the results of the presence of the delay units 7, 8 and 9 and the circuits 1 and 2 in the respective paths as will be apparent to one skilled in the art.

It is to be especially noted that the recovery time of the circuit, i.e., the minimum time following the termination of a given input pulse I before the circuit is prepared to produce a normal response to a subsequent input pulse, is determined by the time that waveform E falls after termination of the given input pulse. That time, in turn, is determined by the number of delay units in path 6. Inasmuch as an input pulse width of 22 units and a delay element of 16 units in path 6 have been assumed, a subsequent input pulse can not occur prior to time unit 38, as shown in FIG. 2, for normal multivibrator response. If a subsequent input pulse were to occur earlier, the output O would be precluded from rising before time unit 38 and a foreshortened (distorted) output pulse would be produced.

Figure 3:
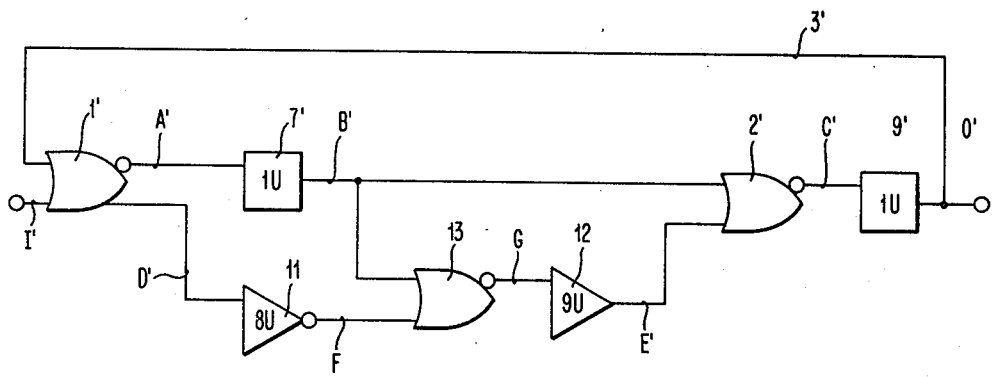
FIG. 3 is a schematic circuit of a representative preferred embodiment of the present invention.

The present invention exploits the fact that the 17 unit delay 8 of FIG. 1 can be constructed from a cascaded chain of lesser delays 11 and 12 whose total delay equals 17 as shown in FIG. 3. Each of the delays 11 and 12 comprises a number of 1 delay unit inverting circuits. Seven such inverting circuits constitute delay 11 whereas 8 such inverting circuits constitute delay 12. Because the seven inverting circuits which constitute delay 11 perform an overall inversion, the output of delay 11 is the complement of its input. The non-inverting 1 unit delay of logic circuit 1 is added to delay 11 thereby bringing its total delay to 8 units. An extra inverting OR circuit 13 (whose non-inverting 1 unit delay is assumed included in delay 12) is added to the circuit of FIG. 3. One input of circuit 13 is connected to the output of delay 7'; the other input is connected to the output of delay 11. The components and waveforms of FIG. 3 which correspond to those of FIG. 1 are designated by the primed numbers and letters.

Figure 4:
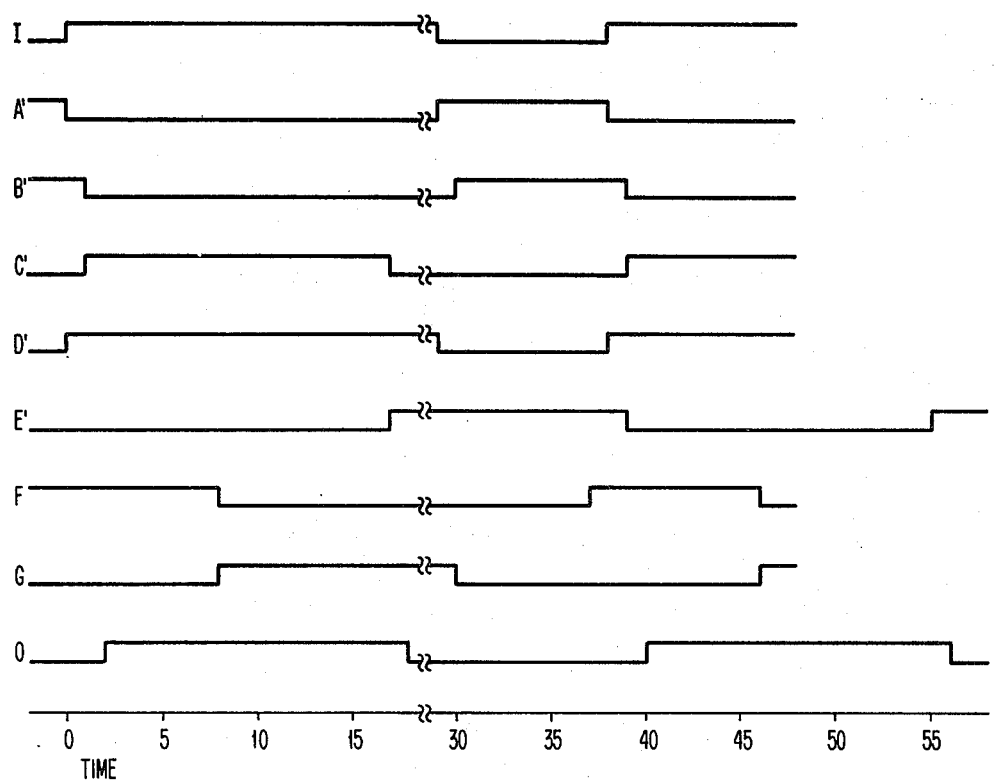
FIG. 4 is a series of idealized waveforms at various points within the circuit of FIG. 3.

The idealized waveforms of FIG. 4 assume that the input pulse I has an extended duration of 29 units but the same repetition interval $T_c$ of 38 units as in the case of FIG. 2. Consequently, the time between successive input pulses (9 units) would be insufficient in the case of FIG. 1 for producing a normal multivibrator response as was previously explained. However, by virtue of added inverting OR circuit 13 and the separation of the 17 unit delay into delays 11 and 12, the multivibrator of FIG. 3 does respond in the normal manner without any foreshortening of the output pulse O'.

As before, the waveforms A', B', C', D', E', F and G have the polarities and durations indicated as the results of the presence of delay units 7', 9', 11 and 12 and the circuits 1', 2' and 13 as will be apparent to one skilled in the art.

The recovery time of the circuit of FIG. 3, like that of FIG. 2 is determined by the time that waveform E' falls after termination of a given input pulse. However, in the case of FIG. 3, although the total delay is still 17 units between circuits 1' and 2', waveform E' falls only 10 units following termination of a given input pulse I', i.e., at time interval 39, exactly as in the case of FIGS. 1 and 2. This desirable result is achieved through provision of the connection between the output of delay 7' and one of the inputs of circuit 13 which effectively bypasses the 8 delay units of delay 11 during the recovery phase of the multivibrator circuit. The presence of the aforementioned connection to circuit 13 produces no change during the active phase of the multivibrator circuit. More particularly, the output pulse width is still determined by the total delay of 17 units of delays 11 and 12, exactly as in the case of FIGS. 1 and 2. Stated another way, the output pulses O and O' of the multivibrators of FIGS. 1 and 3, respectively, are identical despite the differences between the "up" and the "down" portions of the respective input pulses I and I'.

Figure 5:
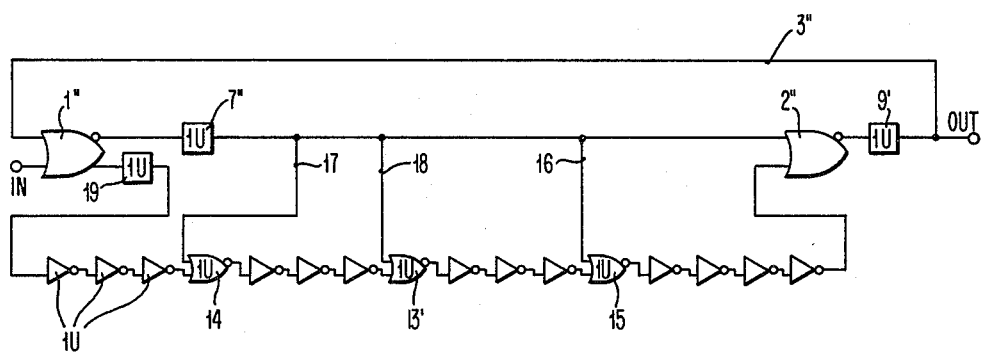
FIG. 5 is a schematic circuit of a further embodiment of the present invention.

Further reduction in the recovery time of the multivibrator is achieved by the provision of additional inverting OR circuits, such as circuits 14 and 15 connected as shown in FIG. 5. A cascaded chain of single inverting delay units (all but three of the units comprising a 1 delay unit inverting circuit) extends between the non-inverting output of circuit 1" and one of the inputs of circuit 2". Inserted in the chain at the positions of the fourth, eighth and twelfth units are inverting OR circuits 14, 13' and 15 which also receive inputs from the output of delay unit 7". The components of FIG. 5 which correspond to those of FIGS. 1 and 3 are designated by the primed and double primed numbers.

Whereas the addition of inverting OR circuit 13 in FIG. 3 reduces the recovery time of the multivibrator to 9/16 of that of FIG. 1, the addition of inverting OR circuits 14, 13' and 15 of FIG. 5 reduces the recovery time of the multivibrator to 5/16 of that of FIG. 1. In FIG. 5, the input via line 16 bypasses all but 5/16 of the total delay of the delay chain connected between inverting OR circuits 1" and 2". It will be recalled that the first 1 delay unit 19 of the chain represents the inherent non-inverting delay of circuit 1". The delay from the bypass line 18 to the input of circuit 15 is 4 units or 4/16 of the total delay of the delay chain. The delay from bypass line 17 to the input of circuit 13' is also 4 units.

The delay from the output of delay block 19 to the input of circuit 14 is 3 units. The largest of the aforementioned delays (5 units) between bypass lines determines and is equal to the recovery time of the multivibrator.

Other reductions in the recovery time of the multivibrator can be achieved by the use of different bypass lines, each with its respective inverting OR circuit placed within the cascaded delay unit chain. The general rules for the placement of the bypass lines are:

(1) The input signal when propagated either through the delay line or through the bypass line must cause equal logic values at the two inputs of the inverting OR circuit connected to the bypass line.

(2) The largest delay among the following paths determines and is equal to the recovery time of the multivibrator:

(a) from the input of the delay line to the first inverting OR circuit, (b) from any bypass line to the input of the next inverting OR circuit, or (c) from the bypass line to the end of the delay line.

I claim:

1. A single shot multivibrator comprising
first and second logic circuits, each having two inputs, and at least one output,
said first circuit being directly connected to one input of said second circuit and, via a delay circuit, to the other input of said second circuit,
said output of said second circuit being directly connected to an output terminal and to one input of said first circuit,
the other input of said first circuit being connected to an input terminal,
said delay circuit comprising a number of cascaded delay units, at least two of which are directly connected to said first circuit.

2. The multivibrator of claim 1 wherein each said logic circuit is an inverting logic circuit.

3. The multivibrator of claim 2 wherein said first circuit has two outputs, one output being in phase with said two inputs and the other output being out of phase with said two inputs,
said one input of said second circuit being directly connected to said other output of said first circuit, and
said other input of said second circuit being connected to said one output of said first circuit via said delay circuit, one of said delay units being connected to said one output of said first circuit and at least another of said delay units being connected to said other output of said first circuit.

4. The multivibrator of claim 3 wherein each of said delay units is an inverting circuit.

5. The multivibrator of claim 4 wherein one of said delay units is an inverting logic circuit connected to said other output of said first circuit.

6. The multivibrator of claim 5 wherein each of said circuits is an inverting OR circuit.

* * * * *